(12) United States Patent
Vaartstra

(10) Patent No.: US 6,666,986 B1
(45) Date of Patent: Dec. 23, 2003

(54) SUPERCRITICAL ETCHING COMPOSITIONS AND METHOD OF USING SAME

(75) Inventor: Brian A. Vaartstra, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 39 days.

(21) Appl. No.: 09/616,170

(22) Filed: Jul. 14, 2000

Related U.S. Application Data

(62) Division of application No. 08/841,886, filed on May 5, 1997, now Pat. No. 6,149,828.

(51) Int. Cl.$^7$ .............................. H01L 21/00; C09K 5/00
(52) U.S. Cl. .................................. 252/79.1; 156/345.29; 216/58; 252/79.2; 252/79.4; 438/706; 438/710; 438/745
(58) Field of Search ............................... 252/79.1–79.4; 438/706, 710, 745; 216/58, 83; 156/345.29

(56) References Cited

U.S. PATENT DOCUMENTS

| | | | |
|---|---|---|---|
| 4,296,146 A | | 10/1981 | Penn |
| 4,725,375 A | * | 2/1988 | Fujii et al. .................. 252/79.4 |
| 4,778,536 A | | 10/1988 | Grebinski |
| 4,861,424 A | | 8/1989 | Fujimura et al. |
| 4,944,837 A | | 7/1990 | Nishikawa et al. |
| 5,013,366 A | | 5/1991 | Jackson et al. |
| 5,037,506 A | | 8/1991 | Gupta et al. |
| 5,256,247 A | * | 10/1993 | Watanabe et al. ........... 156/653 |
| 5,298,112 A | | 3/1994 | Hayasaka et al. |
| 5,382,316 A | | 1/1995 | Hills et al. |
| 5,389,263 A | | 2/1995 | Gallagher et al. |
| 5,401,322 A | | 3/1995 | Marshall |
| 5,403,436 A | | 4/1995 | Fujimura et al. |
| 5,482,211 A | | 1/1996 | Chao et al. ................... 216/57 |
| 5,496,485 A | * | 3/1996 | Maternaghan ............. 252/79.3 |
| 5,635,463 A | * | 6/1997 | Muraoka .................... 510/175 |
| 5,643,474 A | | 7/1997 | Sangeeta |
| 5,651,860 A | | 7/1997 | Li |
| 5,803,956 A | | 9/1998 | Ohmi et al. ................ 106/1.05 |
| 5,885,362 A | * | 3/1999 | Morinaga et al. .............. 134/2 |
| 6,024,801 A | | 2/2000 | Wallace et al. |
| 6,132,522 A | * | 10/2000 | Verhaverbeke et al. ....... 134/26 |
| 6,149,828 A | | 11/2000 | Vaartstra ...................... 216/57 |
| 6,242,165 B1 | | 6/2001 | Vaartstra .................... 430/329 |

FOREIGN PATENT DOCUMENTS

WO    WO 95/20476    8/1995

OTHER PUBLICATIONS

G. Bakker et al., "Removal of Thermally Grown Silicon Dioxide Films Using Water at Elevated Temperature and Pressure", *J. Electrochem. Soc.*, 142(11), 3940–3944 (1995).

M. Dax, "Removing Photoresist Without Plasmas or Liquid Strippers," *Semiconductor International: Contamination Control News*, 52 (Sep. 1996).

(List continued on next page.)

*Primary Examiner*—William A. Powell
(74) *Attorney, Agent, or Firm*—Mueting, Raasch & Gebhardt, P.A.

(57) ABSTRACT

A supercritical etching composition and method for etching an inorganic material of a semiconductor-based substrate are provided. The method includes providing a semiconductor-based substrate having an exposed inorganic material and exposing the substrate to the supercritical etching composition, whereby exposed inorganic material is removed from the substrate. In one embodiment, the supercritical etching composition includes a supercritical component, which is not capable of etching a particular exposed inorganic material, and a nonsupercritical etching component, which is capable of etching the particular exposed inorganic material. In another embodiment, the supercritical etching composition includes a supercritical component, which is capable of etching the particular exposed inorganic material.

19 Claims, 2 Drawing Sheets

OTHER PUBLICATIONS

B.E. Deal et al., "Vapor Phase Wafer Cleaning: Processing fOR the 1990's", *Solid State Technology*, 73–77 (Jul. 1990).

T. Nolan, "Economic Geology and the Bulletin of the Society of Economic Geologists", 45(7), Title Page, Table of Contents, pp. 601, 629–653 (1950).

* cited by examiner

SUPERCRITICAL ETCHING COMPOSITIONS AND METHOD OF USING SAME

This is a division of application Ser. No. 08/841,886, filed May 5, 1997 now U.S. Pat. No. 6,949,828, which incorporated herein by reference.

FIELD OF THE INVENTION

This invention relates to supercritical fluids and, in particular, to supercritical etching compositions and methods for using supercritical etching compositions to etch inorganic material of semiconductor-based substrates.

BACKGROUND OF THE INVENTION

In the fabrication of semiconductor integrated circuits (ICs), various layers of inorganic material form semiconductor-based substrates. Some of the inorganic layers are patterned in desired shapes. The resulting inorganic layers form individual devices and interconnect structures within the IC.

Patterning conventionally includes masking an underlying layer with an organic resist material, such as photoresist, exposing the resist, and removing exposed areas of the mask to form a patterned mask layer. The exposed inorganic layer underlying the patterned mask layer is then removed using an appropriate etchant. The patterned mask layer is then removed.

Etching is a process for removing unwanted material (i.e. partial or complete layers of material) from a surface (e.g., the surface of a semiconductor-based substrate). Organic or inorganic material, which may be patterned or unpatterned, of a substrate surface can be removed using an etching technique. Ideally, etching should precisely remove material that is not covered by a patterned mask layer (i.e., material that is "exposed" when a patterned mask layer is used).

The etchant is typically chemically varied according to the type of material being etched. Etchants are characterized as isotropic or anisotropic. Isotropic etchants remove material in all directions at the same rate. Anisotropic etchants do not remove material in all directions at the same rate. Etchants are further characterized as being selective or non-selective, depending on their ability to differentiate between material that they effectively etch. Selective etchants remove different types of material at different rates.

Etching can occur in a wet or dry processing environment. Wet etching refers to the contact of a substrate surface with a liquid chemical etchant. Material is removed as an agitated liquid or spray, for example, passes over the substrate surface. Dry etching refers to the contact of a substrate surface with a gaseous plasma etchant. Wet etching is preferred over dry etching due to its ability to provide high, reliable throughput with excellent selectivity. One problem associated with conventional wet etching, however, is that etched material constituents may move within etched or partially etched openings on the substrate surface. Thus, all of the etched material constituents are not removed from the substrate surface. Furthermore, oftentimes etchants do not completely wet a substrate surface, resulting in incomplete or nonuniform etching. Another problem associated with wet etching is the isotropic nature of most wet etchants, which is problematic when the minimum pattern dimension of the substrate is comparable to the thickness of the material being etched. In that situation, it is hard to achieve precise pattern dimensions on a substrate.

Overall, the most commonly used wet etchants are hot alkaline etchants or acidic hydrogen peroxide ($H_2O_2$) etchants. Typically, alkaline solutions remove organic films, while acidic solutions remove alkali ions, alkali compounds, and other metallic contaminants. For wet etching silicon (Si), mixtures of nitric acid ($HNO_3$) and hydrofluoric acid (HF) are typically used. For wet etching silicon dioxide ($SiO_2$), various HF solutions are typically used, usually further containing a buffering agent to prevent depletion of fluoride ions from the etchant during etching. Silicon nitride ($Si_3N_4$) is typically wet-etched using a hot phosphoric acid ($H_3PO_4$) solution. Aluminum (Al) is typically wet-etched using a mixture of phosphoric acid ($H_3PO_4$), acetic acid ($CH_3COOH$), nitric acid ($HNO_3$), and water ($H_2O$).

While wet etchants have many preferable characteristics as compared to dry etchants, dry etchants can be used in semiconductor fabrication without the need to dry the substrate being processed after an etching step. The added step of drying the substrate that is required when using a conventional wet etchant adds to the cost of semiconductor device fabrication. A lack of full process automation also results from the added step of drying the substrate. Another advantage of etching with a dry etchant is that it often decreases the safety hazards associated with wet etchants due to the relatively small amount of chemicals utilized in the dry etchant.

Supercritical fluids have been used to etch residue from a variety of surfaces or extract substances from various materials. A gas is determined to be in a supercritical state (and is referred to as a supercritical fluid) when it is subjected to a combination of pressure and temperature so that its density approaches that of a liquid (i.e., the liquid and gas state coexist). Supercritical fluids have been used to clean contact lenses by etching residue from lense surfaces, as disclosed by Bawa et al. in PCT Application Publication Number WO 95/20476. Supercritical fluids, namely carbon dioxide ($CO_2$), have also been used to remove exposed organic photoresist films, as disclosed by Nishikawa et al. in U.S. Pat. No. 4,944,837, to form a patterned photoresist film. As further disclosed in Nishikawa et al., once an underlying layer is patterned by conventional methods, supercritical fluids are used to remove the patterned resist film.

Deionized water at elevated temperatures and pressures, but not supercritical temperatures and pressures, has also been used to etch thermally grown silicon dioxide ($SiO_2$) on a silicon wafer. This was discussed in "Removal of Thermally Grown Silicon Dioxide Films Using Water at Elevated Temperature and Pressure," by Bakker et al., *J. Electrochem. Soc.*, 142, 3940–44 (1995). The paper also discussed the solubility of quartz silicon dioxide ($SiO_2$) in supercritical deionized water. Although Bakker et al. noted the use of supercritical water to promote solubility of quartz (i.e., a large-scale; uncontrolled process, as compared to etching in semiconductor fabrication as discussed in "A Portion of the System Silica-Water," by Kennedy, *Econ. Geol.*, 45, 629, (1950)), Bakker et al. found that the preferred temperature and pressure for etching thermally grown silicon dioxide ($SiO_2$) was below the critical point. Processing steps involved in the fabrication of semiconductor ICs need to be very controlled and precise in order to obtain the optimal density and electrical performance of the resulting IC. Thus, the processing steps utilized to solubilize quartz ($SiO_2$), as compared to thermally grown silicon dioxide ($SiO_2$), are not known to be readily interchangeable to one of ordinary skill in the art due to the differing process criteria. The quartz plates studied by Kennedy involved two contiguous square centimeters in solubilized surface area, while typical etched surface areas on semiconductor-based substrates are about one contiguous square micron or less. Furthermore, Kennedy noted that rough-ground or sawed crystals require a shorter time to solubilize as compared to smooth-lapped or well-polished crystals. Thus, due to the microscopically smooth nature of most layers utilized in semiconductor IC fabrication, it would not have been obvious to one of skill in the art to utilize supercritical water to etch inorganic layers within a semiconductor IC when increasing throughput is a prime fabrication concern.

An etching composition and method of etching various inorganic films in the fabrication of semiconductor ICs is needed that achieves an effective, highly uniform removal of inorganic material across a substrate. It is further desired that the etching composition and method of etching inorganic films be cost-effective and contribute to full process automation during semiconductor fabrication.

SUMMARY OF THE INVENTION

A method for etching an inorganic material of a substrate includes providing a semiconductor-based substrate having an exposed inorganic material and exposing the substrate to a supercritical etching composition to remove at least a portion of the inorganic material from the substrate. The inorganic material preferably includes a material selected from the group of silicon (Si), thermally grown silicon dioxide ($SiO_2$), chemical vapor deposited $SiO_2$, silicon nitride ($Si_3N_4$), aluminum (Al), copper (Cu), borophosphosilicate glass (BPSG), titanium nitride (TiN), titanium (Ti), high dielectric constant (HDC) materials, and combinations thereof.

The method of the present invention is particularly effective at removing HDC materials. HDC materials preferably include tantalum pentoxide ($Ta_2O_5$), yttria ($Y_2O_3$), titanium dioxide ($TiO_2$), strontium bismuth titanate (SBTi), lead zirconate titanate (PZT), lanthanum-doped lead zirconate titanate (PLZT), barium strontium titanate (BST), bismuth titanate (BiTO), strontium titanate (STO), barium titanate (BaTO), strontium bismuth tantalate (SBTa), and combinations thereof.

The substrate can have a patterned mask layer thereon, wherein the inorganic material removed from the substrate includes exposed inorganic material under the patterned mask layer. The inorganic material can also be removed from the substrate in an unpatterned manner (i.e., without the presence of a patterned mask layer on the substrate).

In one embodiment, the supercritical etching composition and method of removing an inorganic material using the composition includes at least one supercritical component and at least one nonsupercritical component. Preferably, the supercritical component is selected from the group of ammonia ($NH_3$), amines ($NR_3$), alcohols (ROH), water ($H_2O$), carbon dioxide ($CO_2$), nitrous oxide $N_2O$), inert gases (e.g., He, Ne, Ar), hydrogen halides (e.g., hydrofluoric acid (HF), hydrochloric acid (HCl), hydrobromic acid (HBr)), boron trichloride ($BCl_3$), chlorine ($Cl_2$), fluorine ($F_2$), hydrocarbons (e.g., dimethyl carbonate ($CO(OCH_3)_2$), methane ($CH_4$), ethane ($C_2H_6$), propane ($C_3H_8$), etc.), fluorocarbons (e.g., $CF_4$, $C_2F_4$, $CH_3F$, etc.), hexafluoroacetylacetone ($C_5H_2F_6O_2$), and combinations thereof. These compounds may be capable of etching without an additional component, depending on the material being etched. If, however, they are not capable of etching in and of themselves, a nonsupercritical component that is capable of etching (i.e., a nonsupercritical etching component) is used. Preferably, the nonsupercritical etching component is selected from the group of ammonia ($NH_3$), hydrofluoric acid (HF), phosphoric acid ($H_3PO_4$), nitric acid ($HNO_3$), acetic acid ($CH_3COOH$), hydrochloric acid (HCl), sulfuric acid ($H_2SO_4$), hydrogen peroxide ($H_2O_2$), nitrous oxide ($N_2O$), nitrogen trifluoride ($NF_3$), sulfur hexafluoride ($SF_6$), ozone ($O_3$), sulfur dioxide ($SO_2$), sulfur trioxide ($SO_3$), amines ($NR_3$), ammonium salts, hexafluoroacetylacetone ($C_5H_2F_6O_2$), and combinations thereof.

In another embodiment, the supercritical etching composition and method of removing an inorganic material using the composition includes a supercritical component that is capable of etching the desired inorganic material in and of itself. Preferably, for such embodiments., the supercritical component is selected from the group of ammonia ($NH_3$), hydrofluoric acid (HF), acetic acid ($CH_3COOH$), nitrous oxide ($N_2O$), nitrogen trifluorde ($NF_3$), hydrochloric acid (HCl), hydrobromic acid (HBr), water ($H_2O$), and combinations thereof. In any of these embodiments, the supercritical etching composition can include a component selected from the group of oxidizers, buffering agents, surfactants, selectivity enhancers, and ligands. These components may be in the supercritical or nonsupercritical state. Thus, they may be present in the supercritical etching composition as supercritical components or nonsupercritical components.

DETAILED DESCRIPTION OF THE INVENTION

Figure 1:
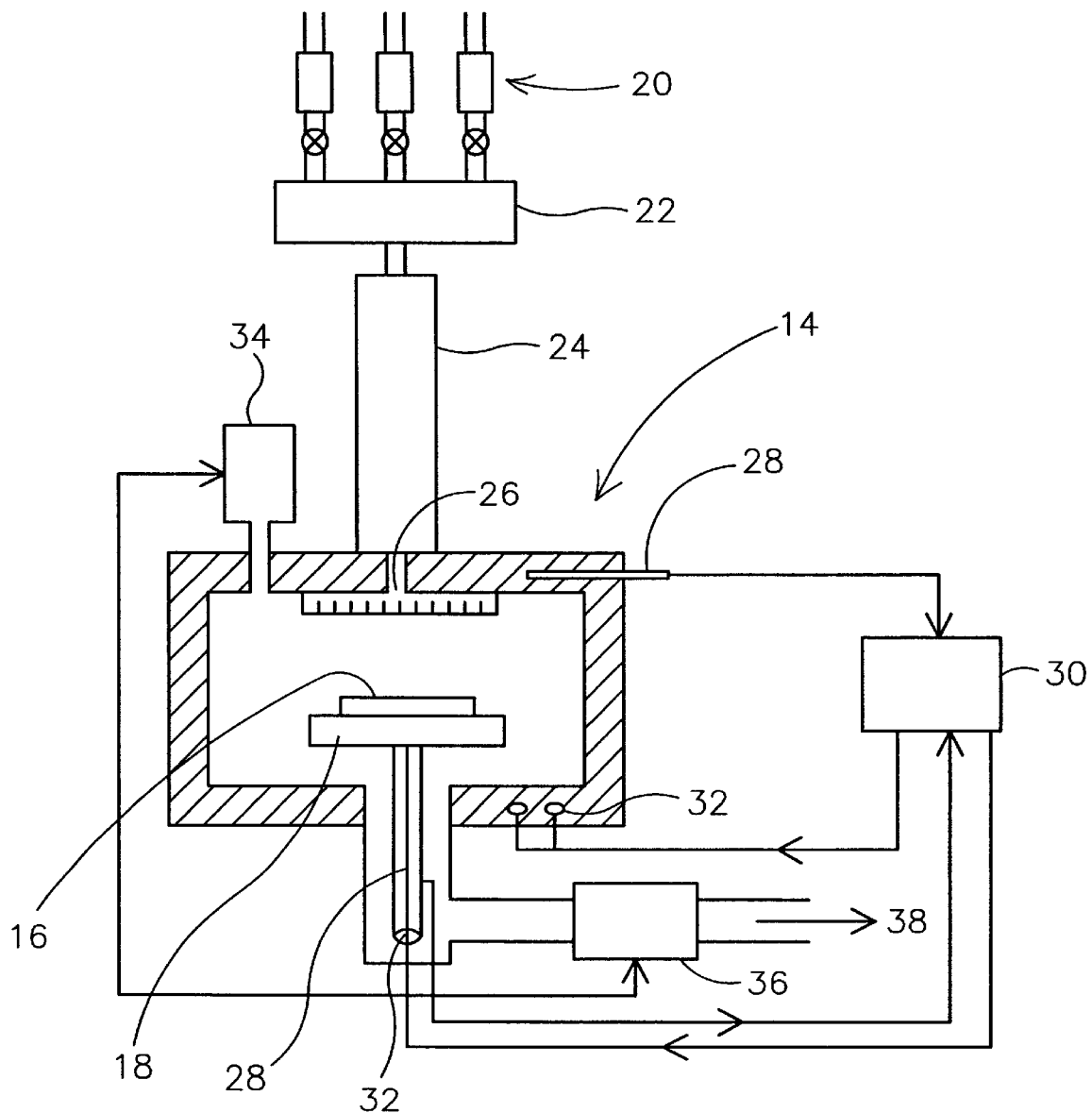
FIG. 1 is a schematic representation of a pressure vessel for use in etching in accordance with the present invention.

Supercritical etching compositions and methods for using such compositions are disclosed herein. The following description is illustrative of various embodiments of the invention. It is to be understood that the term substrate, as used herein, includes a wide variety of semiconductor-based structures that can be etched or have inorganic layers therein that can be etched. A substrate can be a single layer of material, such as a silicon (Si) wafer. Substrate is also to be understood as including silicon-on-sapphire (SOS) technology, silicon-on-insulator (SOI) technology, doped and undoped semiconductors, epitaxial layers of silicon (Si) supported by a base semiconductor, as well as other semiconductor-based structures, including any number of layers as is well known to one skilled in the art. Furthermore, when reference is made to a substrate in the following description, previous process steps may have been utilized to form regions/junctions in a base semiconductor structure. It is also important to note that the substrate being etched can have a patterned mask layer thereon, such as, for example, a patterned resist layer, but it is not required. The following detailed description is, therefore, not to be taken in a limiting sense, and the scope of the present invention is defined by the appended claims.

A gas enters the supercritical state when the combination of pressure and temperature of the environment in which the gas is contained is above a critical state. For example, the critical temperature of carbon dioxide ($CO_2$) is 31° C. The critical pressure of $CO_2$ is 7.38 MPa (72.8 atm). When $CO_2$ is subjected to temperatures and pressures above 31° C. and 7.38 MPa (72.8 atm), respectively, it is in the supercritical state. The critical temperature and pressure of other components is readily calculated or experimentally determined by one skilled in the art. A gas in the supercritical state is referred to as a supercritical fluid. Supercritical fluids have high solvating capabilities that are typically associated with compositions in the liquid state. Supercritical fluids also have a low viscosity that is characteristic of compositions in the gaseous state. Furthermore, supercritical fluids are able to penetrate (i.e., effectively contact) surfaces better than compositions in the liquid state.

At least one supercritical component is used in the compositions of the invention to effectuate the etching process. Supercritical component, as used herein, encompasses all compounds or elements that are present as supercritical fluids. The supercritical component may, or may not, be able to effectively etch a material by itself. If the supercritical component is not an etchant in and of itself for the particular inorganic material to be etched, at least one additive that is capable of etching can be added to the supercritical component. In this embodiment, these additives are nonsupercritical etching components. The addition of a nonsupercritical etching component ensures that the material to be etched will be solubilized, for example, in the supercritical etching composition. Thus, conventional etchants can be utilized in the compositions of this invention to promote the removal of the targeted inorganic material when a supercritical component is used that is not an etchant for the particular material to be removed.

In the following embodiments of the invention, a supercritical component is supplied. The supercritical component can be, for example, ammonia ($NH_3$), amines ($NR_3$), alcohols (ROH), water ($H_2O$), carbon dioxide ($CO_2$), nitrous oxide ($N_2O$), inert gases (e.g., helium (He), neon (Ne), argon (Ar), etc.), hydrogen halides (e.g., hydrofluoric acid (HF), hydrochloric acid (HCl), and hydrobromic acid (HBr)), boron trichloride ($BCl_3$), chlorine ($Cl_2$), fluorine ($F_2$), hydrocarbons (e.g., dimethyl carbonate ($CO(OCH_3)_2$), methane ($CH_4$), ethane ($C_2H_6$), propane ($C_3H_8$), etc.), fluorocarbons (e.g., $CF_4$, $C_2F_4$, $CH_3F$, etc.), hexafluoroacetylacetone ($C_5H_2F_6O_2$), and similar compounds, or combinations of the above. As stated above, there may be more than one supercritical component in the supercritical etching composition. Such components may or may not be known etchants for a particular inorganic material.

In one embodiment, a supercritical component is not capable of etching in and of itself. At least one nonsupercritical component is then added to the supercritical component to form a supercritical etching composition. The nonsupercritical component may be added to the supercritical component either before it is brought to the supercritical state, or after it is brought to the supercritical state. The nonsupercritical component may also be injected into an etching chamber while the substrate is being exposed to the supercritical component. By varying combinations of pressure and temperature, variable etching characteristics can be obtained. For example, increasing pressure on the supercritical etching composition causes its density to increase, thus increasing its solvent strength. Increasing the temperature of the supercritical etching composition normally increases the etching rate of the composition due to increasing the kinetic energy of the etching species.

The nonsupercritical etching component is selected according to known criteria in the art, some of which are discussed above, to provide effective removal of material from a substrate. Preferably, the nonsupercritical etching component is selected from the group of ammonia ($NH_3$), hydrofluoric acid (HF), phosphoric acid ($H_3PO_4$), nitric acid ($HNO_3$), acetic acid ($CH_3COOH$), hydrochloric acid (HCl), sulfuric acid ($H_2SO_4$), hydrogen peroxide ($H_2O_2$), nitrous oxide ($N_2O$), nitrogen trifluoride ($NF_3$), sulfur hexafluoride ($SF_6$), ozone ($O_3$), sulfur dioxide ($SO_2$), sulfur trioxide ($SO_3$), amines ($NR_3$), ammonium salts (e.g., tetramethyl ammonium hydroxide (TMAH), ammonium fluoride ($NH_4F$), etc.), hexafluoroacetylacetone ($C_5H_2F_6O_2$), and combinations thereof. Chemical constituents in the nonsupercritical etching component vary. For example, ammonia ($NH_3$) can be used when it is desired to remove titanium nitride (TiN), aluminum (Al), and aluminum/copper (Al/Cu) alloys from a substrate. Hydrofluoric acid (HF) can be used when it is desired to remove silicon (Si), thermally grown silicon dioxide ($SiO_2$), chemical vapor deposited $SiO_2$, or metals, such as titanium (Ti) or Al/Cu alloys from a substrate. Phosphoric acid ($H_3PO_4$) can be used when it is desired to remove silicon nitride (SiN) or Al from a substrate. Nitric acid ($HNO_3$) can be used when it is desired to remove Si or Al from a substrate. Acetic acid ($CH_3COOH$) can be used when it is desired to remove Al from a substrate.

It is desirable to be able to selectively control the material being etched. For example, although $CO_2$ is known to remove photoresist material when used in a supercritical state, the supercritical etching composition of the present invention can be tailored using components other than $CO_2$ to etch exposed material beneath a patterned photoresist layer, without simultaneously etching the photoresist layer. Likewise, when more than one inorganic material is present at an exposed surface of a substrate, the supercritical etching composition can be tailored to effectively etch only one, or only selected layers, of the materials.

In another embodiment, the supercritical component is capable of etching in and of itself. For example, the supercritical component is an etchant for the particular inorganic material in the supercritical state, such as ammonia ($NH_3$), hydrofluoric acid (HF), acetic acid ($CH_3COOH$), nitrous oxide ($N_2O$), nitrogen trifluoride ($NF_3$), hydrochloric acid (HCl), hydrobromic acid (HBr), water ($H_2O$), and combinations thereof. Chemical components in the supercritical component of this embodiment are selected according to criteria well known in the art, as described above, to effectively etch the particular inorganic material. Numerous wet etchants are convertible into the supercritical state by subjecting them to a temperature or pressure above their critical temperature or critical pressure, respectively. By varying combinations of pressure and temperature used in converting etchants to the supercritical state, variable etching characteristics can be obtained, as described previously. Supercritical etching compositions according to this embodiment can also include nonsupercritical components. For example, nonsupercritical etching components can also be added to the supercritical component.

In a further embodiment of the invention, the supercritical etching composition can further include components, such as oxidizers (e.g., hydrogen peroxide ($H_2O_2$), nitrogen trifluoride ($NF_3$), ozone ($O_3$), oxygen ($O_2$), halogens (e.g., $F_2$, $Cl_2$, $Br_2$, $I_2$), sulfur dioxide ($SO_2$), sulfur trioxide ($SO_3$)), buffering agents (e.g., ammonium fluoride ($NH_4F$), tetramethyl ammonium fluoride ($Me_4NF$)), surfactants, selectivity enhancers (e.g., tetramethyl ammonium hydroxide ($Me_4NOH$), tetramethyl ammonium fluoride ($Me_4NF$), and ammonium fluoride ($NH_4F$)), or ligands (e.g., beta-diketones, fluorinated-diketones, organic acids, and the like) to enhance the etching effectiveness. In particular, the addition of ligands promotes removal of metal from a substrate. The addition of ligands in the supercritical etching composition is particularly beneficial for etching HDC materials. These components, as well as many others, can be added to the supercritical etching composition. These components may or may not be in the supercritical state. Thus, they may be supercritical components or nonsupercritical components.

According to the present invention, a substrate having material that is to be removed (e.g., a semiconductor-based substrate with an inorganic material of an exposed surface) is exposed to the supercritical etching composition. A preferred process sequence utilizes an apparatus preferably customized for the particular supercritical etching composition. For example, the pressure vessel 14 of FIG. 1 is a useful tool in which to expose the substrate 16 to the supercritical etching composition. The pressure vessel 14 includes a chuck 18 for supporting and/or rotating the substrate 16. Mass or liquid flow controllers 20 control the input of each component of the supercritical etching composition. For example, a supercritical component (prior to being brought to the supercritical state) and a nonsupercritical component (if used) each enter the pressure vessel 14 directly through a separate controller 20. It should be understood, however, that an apparatus can be used that allows for the mixing of the components prior to their entering the pressure vessel 14.

As illustrated in FIG. 1, the components can be pre-mixed in a mixing manifold 22. The components can also be brought to the supercritical state in the mixing manifold 22 by including heating coils or vanes in the manifold 22 walls to increase heat transfer to the components before passing through an optional circulation heater 24, such as a circulation heater supplied by Watlow Co. of Saint Louis, Mo. The supercritical etching composition then enters the pressure vessel 14 through a dispensing device 26, such as a shower-head. The circulation heater 24 is preferably used to increase the efficiency of the system when creating the supercritical etching composition in the mixing manifold 22 prior to entering the pressure vessel 14. The supercritical etching composition passes over the substrate 16 from the dispensing device 26.

It is also to be understood that the supercritical etching composition can optionally pass directly over the substrate 16 from a heated transfer line without using a dispensing device 26. Alternatively, each component of the supercritical etching composition can enter the pressure vessel through plumbed supply lines, where the components can then be brought to the supercritical state. The supercritical etching composition is passed over the substrate 16 until the desired thickness has been etched away.

Temperature and pressure within the pressure vessel 14 should be at or above the critical temperature and pressure for the supercritical component. The etching component is then dissolved in the supercritical composition as a nonsupercritical component or is itself in the supercritical state as part of the supercritical component, depending on the temperature and pressure within the pressure vessel 14. A thermocouple 28 monitors temperature within the pressure vessel 14 and relays an appropriate signal to a temperature control unit 30. The temperature control unit 30 sends appropriate signals to heater inputs 32, which provide heat to the pressure vessel 14. A pressure gauge 34 monitors pressure within the pressure vessel 14 and sends appropriate signals to a pressure control unit 36, which pressurizes/depressurizes the pressure vessel 14. Excess composition is vented or pumped through a vent or pumping system in the direction indicated by arrow 38. The supercritical etching composition passes from the pressure vessel 14 to the vent or pumping system 38 by operation of a pressure differential between adjacent chambers. The pressure in the vent or pumping system 38 is lower than the pressure within the pressure vessel 14 causing this transfer.

Figure 2:
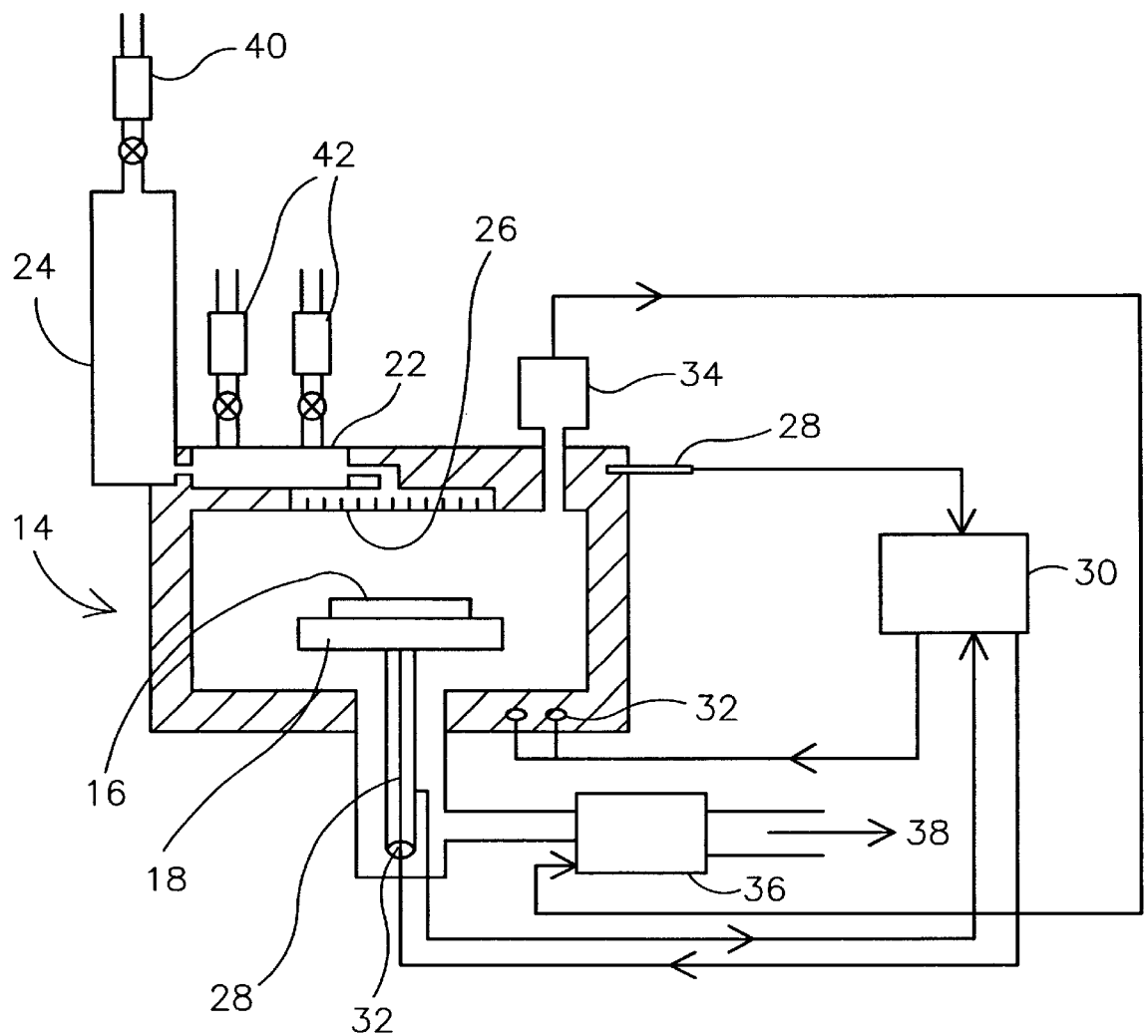
FIG. 2 is a schematic representation of another pressure vessel for use in etching in accordance with the present invention.

Alternatively, a tool as illustrated in FIG. 2 can be useful for removing material from a substrate 16 using supercritical etching compositions of the invention. The tool illustrated in FIG. 2 is similar to the tool illustrated in FIG. 1, but the supercritical component (prior to being brought to the supercritical state) first flows from mass or liquid flow controller 40 through circulation heater 24 prior to entering the mixing manifold 22, where any nonsupercritical components enter through mass or liquid flow controllers 42. When the supercritical component is capable of etching a particular inorganic material in and of itself, and when using the tool illustrated in FIG. 2, a nonsupercritical etching component need not be added to the mixing manifold 22 from mass or liquid flow controllers 42, although the supercritical component is supplied from mass or liquid flow controller 40.

A wide variety of inorganic materials can be effectively etched using the compositions and methods of the present invention. For example, silicon (Si), thermally grown silicon dioxide ($SiO_2$), chemical vapor deposited $SiO_2$, silicon nitride ($Si_3N_4$), borophosphosilicate glass (BPSG), titanium nitride (TiN), titanium (Ti), aluminum (Al), copper (Cu), and similar materials used in semiconductor processing, and combinations thereof, can be removed in accordance with the present invention. Also, evolving high dielectric constant (HDC) materials (i.e., those having a dielectric constant of greater than about 7) are advantageously etched in accordance with the present invention. Known HDC materials include: tantalum pentoxide ($Ta_2O_5$), yttria ($Y_2O_3$), titanium dioxide ($TiO_2$), strontium bismuth titanate (SBTi), lead zirconate titanate (PZT), lanthanum-doped lead zirconate titanate (PLZT), barium strontium titanate (BST), bismuth titanate (BiTO); strontium titanate (STO), barium titanate (BaTO), and tantalates, such as strontium bismuth tantalate (SBTa). For example, $Ta_2O_5$ potentially has a dielectric constant ($\in$) more than 20 times greater than conventional silicon oxide, which has a dielectric constant ($\in$) of 3.9. BST has a dielectric constant ($\in$) about 100 times as large as that of a conventional thermally grown silicon dioxide ($SiO_2$) film or a silicon nitride ($Si_3N_4$, having a $\in$ of about 7) film.

As consumer demand for smaller computing devices and increased memory storage therein increases, it is important to effectively adapt HDC materials for use in fully automated fabrication of capacitive memory cells. Previously, for example, such HDC materials were difficult to remove at relatively low temperatures. Furthermore, such HDC materials could only be removed using a wet etchant solvated in strong organic solvents. It is desirable to decrease the use of relatively high temperature processing steps for relatively long periods of time. A process sequence in the fabrication of semiconductor integrated circuits (ICs) ideally maintains a relatively low thermal budget. The thermal budget for an IC process sequence is that combination of time and temperature for heat treatments utilized in the fabrication of the IC, above which electrical performance of the IC is possibly degraded. An IC can only be subjected to a limited number of thermal steps for a limited amount of time before its electrical performance is potentially detrimentally affected. For example, thermal steps often cause dopant gradients at junctions between two regions in an IC to diffuse, such that the potential barrier between the two regions is altered. Furthermore, thermal steps often cause dopants to migrate into undesired regions, altering device characteristics. Because access transistors are formed prior to the capacitor in many dynamic random access memory (DRAM) devices, it is desirable to use relatively low temperatures to form the capacitor because higher temperatures cause dopants to diffuse, forming dopant gradients, across the many junctions therein.

Thus, due to the etching temperatures of this invention being relatively low, such as slightly above 31° C. when using a $CO_2$ supercritical component, the thermal budget is conserved. Other examples of relatively low critical temperatures and their respective critical pressures for various supercritical components include: $N_2O$ (36.5° C., 7.26 MPa), $C_2H_6$ (32.2° C., 4.88 MPa), $CH_3F$ (44.6° C., 5.88 MPa), HBr (90° C., 8.56 MPa), and HCl (51.4° C., 8.32 MPa). A supercritical component is selected accordingly. For example, when substrates are not as thermally sensitive, supercritical components having higher critical temperatures can be used. For example, supercritical components having higher critical temperatures include: $H_2O$ (374.1° C., 22.11 MPa), methanol (240° C., 10.23 MPa), ammonia (132.5° C., 11.40 MPa), and dimethyl amine (164.6° C. 5.31 MPa).

Supercritical etching compositions can be environmentally advantageous over current chemistries, particularly where $CO_2$ is the supercritical component. $CO_2$ is much less toxic than standard wafer cleaning strategies. Supercritical fluids offer high purity where etchants are converted to a supercritical state without the need for a non-etching supercritical component. Supercritical fluids are also capable of being relatively easy to recycle. Due to the high rate of penetration that is characteristic of supercritical fluids as compared to wet etchants, etching in accordance with the present invention is more uniform. Uniformity is promoted due to the superior wetting abilities of supercritical etching compositions, along with their ability to break away etched material from within etched or partially etched openings on the substrate surface. Another desirable advantage of some of the supercritical etching compositions and methods of the present invention is that aqueous solvent systems and alcohols can be eliminated from the etching step. By eliminating such wet solvents, a drying step is not needed in the IC processing sequence subsequent to etching steps in accordance with the present invention. Elimination of such drying steps contributes to optimizing efficiency in the fabrication of ICs.

The following examples are meant to be illustrative of numerous embodiments of practicing the invention. They are meant to be understood as examples only, and not limiting on the scope of the invention.

EXAMPLES

Example 1

In this example, the supercritical component is capable of etching in and of itself. The tool of FIG. 1 is heated to above the critical temperature (188° C.) of HF. The pressure vessel 14 is then charged with electronic grade HF at a pressure of 6.58 MPa. A desired flow of the supercritical etching composition, HF, flows into the pressure vessel 14 from a mass flow controller 20. A desired pressure is maintained in the pressure vessel 14 using the pressure controller 36 with a feedback loop coupled to the venting outlet valves 38 of the pressure vessel 14.

Example 2

A substrate 16 having a surface layer of copper is placed on the chuck 18 in the tool of FIG. 2. The chuck 18, pressure vessel 14 wall, and circulation heater 24 are all heated to 60° C. The supercritical component is $CO_2$. A flow of 100 sccm $CO_2$ is established through the system from mass flow controller 40, with pressure controlled to 10.13 MPa (100 atm) using pressure controller 36. A nonsupercritical etching component hexafluoroacetylacetone ($C_5H_2F_6O_2$), is introduced into the mixing manifold 22 using a syringe pump, at a rate of 0.90 mL/minute to form the supercritical etching composition. Thus, the supercritical etching composition comprises dissolved $C_5H_2F_6O_2$. The supercritical etching composition is passed over the substrate 16 from a showerhead 26 until a desired thickness of copper is removed.

Example 3

A substrate 16 having a surface layer of thermally grown silicon dioxide ($SiO_2$) is placed on the chuck 18 in the tool of FIG. 2. The chuck 18, pressure vessel 14 wall, and circulation heater 24 are all heated to 375° C. The supercritical component in this example, deionized water, is capable of etching in and of itself. Deionized water is provided to the circulation heater 24 from liquid flow controller 40 at a flow rate of 10 mL/minute, with an established pressure of 22.29 MPa (220 atm), to form the supercritical etching composition. The supercritical etching composition is passed over the substrate 16 from showerhead 26. Flow of the supercritical etching composition under these conditions is maintained until a desired thickness of the oxide has been removed.

All patents, patent applications, and publications disclosed herein are incorporated by reference in their entirety, as if individually incorporated. The foregoing detailed description and examples have been given for clarity of understanding only. No unnecessary limitations are to be understood therefrom. The invention is not limited to the exact details shown and described, for variations obvious to one skilled in the art will be included within the invention defined by the claims.

What is claimed is:

1. A non-aqueous supercritical etching composition comprising a supercritical component capable of etching an inorganic material of a semiconductor-based substrate, wherein the supercritical component is selected from the group consisting of ammonia, hydrofluoric acid, acetic acid, nitrous oxide, nitrogen trifluoride, hydrochloric acid, hydrobromic acid, and combinations thereof.

2. The composition of claim 1, comprising a component selected from the group consisting of an oxidizer, a buffering agent, a surfactant, a selectivity enhancer, a ligand, and combinations thereof.

3. The composition of claim 1, comprising at least one supercritical component and at least one nonsupercritical etching component.

4. The composition of claim 3, comprising a component selected from the group consisting of an oxidizer, a buffering agent, a surfactant, a selectivity enhancer, a ligand, and combinations thereof.

5. The composition of claim 3, wherein the nonsupercritical etching component is selected from the group consisting of ammonia, hydrofluoric acid, phosphoric acid, nitric acid, acetic acid, hydrochloric acid, sulfuric acid, hydrogen peroxide, nitrous oxide, nitrogen trifluoride, sulfur hexafluoride, ozone, sulfur dioxide, sulfur trioxide, an amine, an ammonium salt, hexafluoroacetylacetone, and combinations thereof.

6. The composition of claim 2, wherein the oxidizer is selected from the group consisting of hydrogen peroxide, nitrogen trifluoride, ozone, oxygen, halogens, sulfur dioxide, sulfur trioxide, and combinations thereof.

7. The composition of claim 2, wherein the selectivity enhancer is selected from the group consisting of tetramethyl ammonium hydroxide, tetramethyl ammonium fluoride, ammonium fluoride, and combinations thereof.

8. The composition of claim 4, wherein the oxidizer is selected from the group consisting of hydrogen peroxide, nitrogen trifluoride, ozone, oxygen, halogens, sulfur dioxide, sulfur trioxide, and combinations thereof.

9. The composition of claim 4, wherein the selectivity enhancer is selected from the group consisting of tetramethyl ammonium hydroxide, tetramethyl ammonium fluoride, ammonium fluoride, and combinations thereof.

10. A non-aqueous supercritical etching composition comprising a supercritical component capable of etching an inorganic material of a semiconductor-based substrate, wherein the supercritical component is selected from the group consisting of ammonia, an amine, an alcohol, carbon dioxide, nitrous oxide, an inert gas, a hydrogen halide, boron trichloride, chlorine, fluorine, a hydrocarbon, a fluorocarbon, hexafluoroacetylacetone, and combinations thereof.

11. The composition of claim 10, comprising a component selected from the group consisting of an oxidizer, a buffering agent, a surfactant, a selectivity enhancer, a ligand, and combinations thereof.

12. The composition of claim 11, wherein the oxidizer is selected from the group consisting of hydrogen peroxide, nitrogen trifluoride, ozone, oxygen, halogens, sulfur dioxide, sulfur trioxide, and combinations thereof.

13. The composition of claim 11, wherein the selectivity enhancer is selected from the group consisting of tetramethyl ammonium hydroxide, tetramethyl ammonium fluoride, ammonium fluoride, and combinations thereof.

14. A supercritical etching composition comprising a supercritical component selected from the group consisting of ammonia, an amine, an alcohol, water, carbon dioxide, nitrous oxide, an inert gas, a hydrogen halide, boron trichloride, chlorine, fluorine, a hydrocarbon, a fluorocarbon, hexafluoroacetylacetone, and combinations thereof, and a nonsupercritical component selected from the group consisting of ammonia, hydrofluoric acid, phosphoric acid, nitric acid, acetic acid, hydrochloric acid, sulfuric acid, hydrogen peroxide, nitrous oxide, nitrogen trifluoride, sulfur hexafluoride, ozone, sulfur dioxide, sulfur trioxide, amines, ammonium salts, hexafluoroacetylacetone, and combinations thereof.

15. A supercritical etching composition comprising a supercritical component selected from the group consisting of an alcohol, water, carbon dioxide, nitrous oxide, an inert gas, a hydrogen halide, boron trichloride, chlorine, fluorine, a hydrocarbon, a fluorocarbon, hexafluoroacetylacetone, and combinations thereof, and a nonsupercritical etching component selected from the group consisting of hydrofluoric acid, phosphoric acid, nitric acid, acetic acid, hydrochloric acid, sulfuric acid, hydrogen peroxide, nitrous oxide, nitrogen trifluoride, sulfur hexafluoride, ozone, sulfur dioxide, sulfur trioxide, hexafluoroacetylacetone, and combinations thereof.

16. The composition of claim 15, comprising a component selected from the group consisting of an oxidizer, a buffering agent, a surfactant, a selectivity enhancer, a ligand, and combinations thereof.

17. The composition of claim 16, wherein the oxidizer is selected from the group consisting of hydrogen peroxide, nitrogen trifluoride, ozone, oxygen, halogens, sulfur dioxide, sulfur trioxide, and combinations thereof.

18. The composition of claim 16, wherein the selectivity enhancer is selected from the group consisting of tetramethyl ammonium hydroxide, tetramethyl ammonium fluoride, ammonium fluoride, and combinations thereof.

19. A supercritical etching composition consisting essentially of at least one supercritical component capable of etching an inorganic material of a semiconductor-based substrate and at least one nonsupercritical etching component, wherein the supercritical component is selected from the group consisting of ammonia, hydrofluoric acid, acetic acid, nitrous oxide, nitrogen trifluoride, hydrochloric acid, hydrobromic acid, and combinations thereof, and wherein the nonsupercritical etching component is selected from the group consisting of ammonia, hydrofluoric acid, phosphoric acid, nitric acid, acetic acid, hydrochloric acid, sulfuric acid, hydrogen peroxide, nitrous oxide, nitrogen trifluoride, sulfur hexafluoride, ozone, sulfur dioxide, sulfur trioxide, an amine, an ammonium salt, hexafluoroacetylacetone, and combinations thereof.

* * * * *

UNITED STATES PATENT AND TRADEMARK OFFICE
CERTIFICATE OF CORRECTION

PATENT NO.   : 6,666,986 B1
DATED        : December 23, 2003
INVENTOR(S)  : Vaartstra It is certified that error appears in the above-identified patent and that said Letters Patent is hereby corrected as shown below:

<u>Column 4,</u>
Line 14, please delete "trifluorde" and insert -- trifluoride --.

Signed and Sealed this

Twenty-seventh Day of July, 2004

JON W. DUDAS
*Acting Director of the United States Patent and Trademark Office*